United States Patent

Betz et al.

[11] Patent Number: 4,692,203
[45] Date of Patent: Sep. 8, 1987

[54] PROCESS FOR MAKING BETA-ZINC DIPHOSPHIDE MONOCRYSTALS (WHISKERS)

[75] Inventors: Thomas Betz, Wiehl-Bielstein; Hans-Georg von Schnering, Aidlingen; Erich Schönherr, Leonberg, all of Fed. Rep. of Germany

[73] Assignee: Hoechst Aktiengesellschaft, Frankfurt am Main, Fed. Rep. of Germany

[21] Appl. No.: 899,941

[22] Filed: Aug. 25, 1986

[30] Foreign Application Priority Data

Sep. 7, 1985 [DE] Fed. Rep. of Germany ....... 3531949

[51] Int. Cl.$^4$ ............................................. C30B 23/00
[52] U.S. Cl. ........................... 156/610; 156/DIG. 70; 156/DIG. 77; 156/DIG. 112
[58] Field of Search ....... 156/610, DIG. 70, DIG. 77, 156/DIG. 112; 252/301.6 P; 148/6.15 Z

[56] References Cited

U.S. PATENT DOCUMENTS 3,033,659 4/1959 Fischer ............................... 156/610
3,210,149 3/1962 Eland .................................. 156/610

OTHER PUBLICATIONS

Gorban et al., "Electrical Properties of ZnP$_2$ Single Crystals . . . " Phys. Status Solidi A, 48(2), 329–334, 1978.

Mowles, T., "Synthesis of Monoclinic ZnP$_2$ Single Crystals", Report 1978, LBL-7661, 68 pages.

Piper, W., "Growth of Zinc Sulfide Crystals", J. Chem. Phys., vol. 20, p. 1343, 1952.

Kuo et al., "Growth and Structure of Zinc Diphosphide Crystals", Ch'eng-Kung Ta Hsueh Hsueh Pao, K'o Chi Pien, 17, 7–11.

Primary Examiner—William R. Dixon, Jr.
Assistant Examiner—R. Bruce Breneman
Attorney, Agent, or Firm—Connolly and Hutz

[57] ABSTRACT

$\beta$-zinc diphosphide monocrystals ($\beta$-ZnP$_2$) (whiskers) having a diameter of at least 7 mm are made. To this end, a quartz ampoule is filled up to 70–90% its volume with polycrystalline $\beta$-ZnP$_2$; the ampoule is sealed and drawn in upright position at a velocity of 0.5–2.5 mm/day during a period of 24–120 days through a kiln; the temperature outline from below to above in the kiln is defined by a lower inlet temperature of 580°–780° C., a mean maximum temperature of 800°–950° C. and an upper outlet temperature of 350°–400° C.; the ampoule coming from the furnace is crushed and $\beta$-ZnP$_2$ condensed into a monocrystal via the gas phase by sublimation into the upper ampoule portion is removed.

2 Claims, 1 Drawing Figure

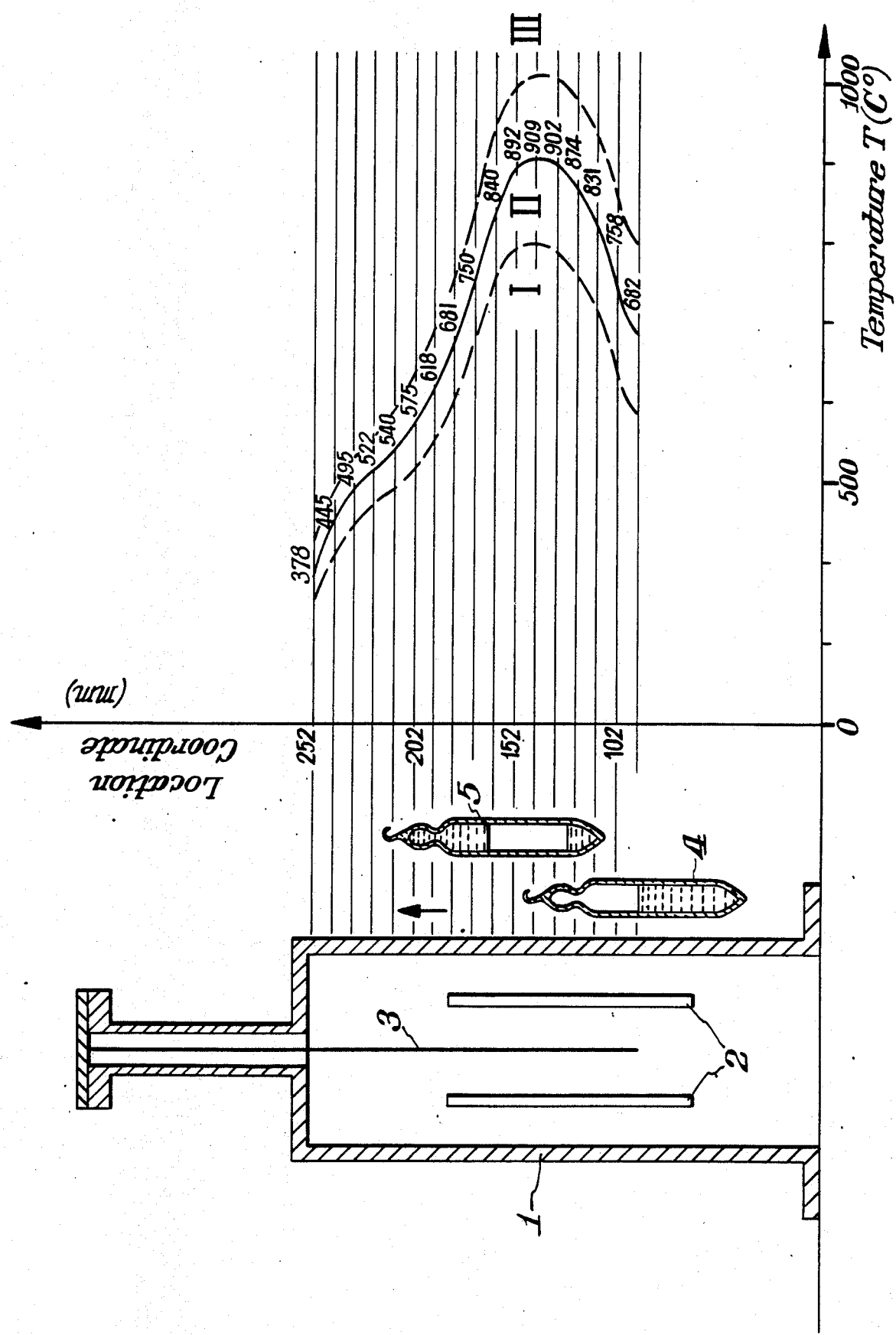

PROCESS FOR MAKING BETA-ZINC DIPHOSPHIDE MONOCRYSTALS (WHISKERS)

This invention relates to a process for making $\beta$-zinc diphosphide monocrystals ($\beta$-ZnP$_2$) (whiskers) having a diameter of at least 7 mm.

It is the photovoltaic properties which make this material so important. During these last decennia, the use of semiconductors has strongly increased and so has also the demand for semiconductor materials which find more and more widespread uses. More particularly, there is a considerable increase in the potential uses of those semiconductors which have additional useful photoelectric properties, e.g. the property of permitting sunlight to be economically transformed into electric potentials. Monocrystalline materials have such property.

$\beta$-ZnP$_2$ is customarily synthesized by subjecting zinc or Zn$_3$P$_2$ to a solid matter reaction with red phosphorus in a closed reaction system to give $\beta$-ZnP$_2$ which is obtained in the form of needle-shaped, partially hollow crystals, that tend to twin formation of pseudoorthorhombic symmetry. These crystalline individuals have a size of a few millimeters limiting their industrial uses considerably. In addition to this, they undergo corrosion fairly rapidly in moist air or in an aqueous electrolytic system, which is disadvantageous.

It has also been reported that larger $\beta$-ZnP$_2$ monocrystals (50 mm long and 12 mm wide) are obtainable from a Zn-P-melt using phosphorus under a pressure of 20,000-50,000 bars (W. Zdanowicz et al., Ac. Phys. Pol. A 48, 27-31 (1975)). Needless to say, such high phosphorus pressures are extremely difficult to control and in fact prohibit commercial operation.

At 990° C., $\beta$-ZnP$_2$ undergoes incongruent fusion, i.e. with decomposition to Zn$_3$P$_2$ and P and formation of a pertectic. It has therefore been held that ZnP$_2$ would decompose into Zn$_3$P$_2$ and gaseous phosphorus, even in sublimation experiments.

The present process for making $\beta$-zinc diphosphide monocrystals by the prior Pizzarello technique (cf. F. Pizzarello, J. Appl. Phys. 25 (1954), 804 and E. Schönherr, The Growth of Large Crystals from the Vapor Phase, in: Crystals—Growth, Properties and Applications, vol. 2, edited by H. C. Freyhardt, pages 51-118, Springer-Verlag, Berlin 1980) unexpectedly permits monocrystalline $\beta$-ZnP$_2$ to be obtained without decomposition via the gas phase by an appropriate selection of the reaction parameters.

The feed material which should conveniently be used is polycrystalline (needle-shaped crystals) $\beta$-ZnP$_2$ obtainable via the gas phase by conventional solid matter reaction, e.g. by subjecting an intimate blend of zinc and red phosphorus to heat treatment in accordance with the equation Zn+2P (red)=ZnP$_2$ (cf. I. A. Mowles, C.A. 91 (1979), 66453k). The kinetic retardation of the sublimation can be annulled by the addition of catalytically active quantities of readily volatile substances, such as I$_2$ or P$_2$I$_4$. Monoclinic, partially hollow $\beta$-ZnP$_2$ crystals separated in the center portion of the reaction ampoule were investigated X-ray photographically by the Guinier-Jagodzinski method in a Guinier chamber; X-ray photographs indicated the existence of phase-uniform $\beta$-ZnP$_2$ specimens.

The present process comprises more particularly: filling a quartz ampoule up to 70-90% its volume with polycrystalline $\beta$-ZnP$_2$; sealing the ampoule; conveying it in upright position at a velocity of 0.5-2.5 mm/day over a period of 24-120 days through a kiln in which the temperature outline from below to above is defined by a lower inlet temperature of 580°-780° C., a mean maximum temperature of 800°-950° C. and an upper outlet temperature of 350°-400° C.; crushing the ampoule coming from the furnace and taking the $\beta$-ZnP$_2$ condensed into a monocrystal via the gas phase by sublimation into the upper ampoule portion. Further preferred and optional features of the invention provide:

(a) for the quartz ampoule to be maintained under an outer inert gas pressure of 20-60 bars during the heat treatment;
(b) for the quartz ampoule to have an upper constricted end portion;
(c) for the $\beta$-ZnP$_2$ monocrystal to be sliced.

The process of this invention can be carried out in a growing reactor (1) shown diagrammatically in longitudinal section and in simplified fashion in the left hand portion of the accompanying drawing. It comprises a tubular graphite resistance heater (2) which is heated with the aid of a temperature regulator controlled by means of a thermocouple. The heating is more particularly effected so as to establish a temperature outline as a function of the height, as shown by way of example (size not true to scale) in the right hand portion of the accompanying drawing. The regulator temperatures are approximately 650° C. for curve I, 760° C. for curve II and 875° C. for curve III.

By means of drawing rod (3) a quartz ampoule (4) and (5) filled with $\beta$-ZnP$_2$ is drawn upwardly through the graphite resistance heater (2) at an extremely low velocity (e.g. 2 mm/day) over a period of weeks. A filled ampoule having a constricted upper end portion is shown symbolically (size not true to scale) at the right hand side of the growing reactor (1), at different levels, before and after the growth of the monocrystal. The constricted upper end portion of the ampoule is used for selecting a seed crystal.

It is possible for the growing reactor (1) to be first evacuated and for an inert gas pressure (argon or nitrogen) e.g. of 50 bars, to be then established so as to provide an opportunity for compensating from the outside the pressure establishing inside the quartz ampoule during the crystal growth process.

The temperature outline selected in accordance with this invention is particularly advantageous. The reason resides in the fact that the supersaturated region of the gas phase necessary for the growth of the monocrystal is confined—thanks to a steep temperature gradient—to a small local region of the ampoule immediately ahead of the phase boundary towards the growing monocrystal. In this way, the tendency to "parasite seed crystal"-formation is minimized.

Its physical characteristic properties (direct band-gap: $\Delta E \approx 1.4$ ev; electric conductivity $\Sigma \approx 5 \times 10^{-3} \Omega^{-1} \times cm^{-1}$) make the monocrystalline $\beta$-ZnP$_2$ of this invention highly suitable for use in the production of solid matter solar cells and redox electrolytic solar cells, i.e. formation of the Mott-Schottky-barrier by semiconductor/electrolyte-contact. It is possible for the p-conducting material to be given a n-doping by the addition of elements belonging to the 6th principal group of the Periodic System, especially selenium. $\beta$-ZnP$_2$ shows a direct band-gap at about 1 ev and solar cells made therefrom are therefore more efficient than those made from silicon having an indirect band-gap at about 1.1. ev.

EXAMPLE 6.3 g polycrystalline $\beta$-ZnP$_2$ was fused under a vacuum of $10^{-5}$ bar into a quartz glass ampoule which had an outer diameter of 20 mm, a wall thickness of 4 mm, a length of 70 mm and was provided with a constricted upper end portion for the selection of seed crystals. The fusion point was post-annealed using a hydrogen flame to avoid stresses inside the glass. The growing ampoule so filled and sealed was placed in graphite resistance heater (2) (outside diameter=50 mm, inside diameter=42 mm, length=120 mm) and exposed therein to a temperature gradient such as that shown in the accompanying drawing. The resulting temperature outline corresponded to the establishment of a temperature of 760° C. in the temperature regulator (cf. drawing, curve II—unbroken line—to an inlet temperature of 682° C., to a maximum temperature of 909° C., and to a final temperature of 378° C. By varying the regulator adjustments it was possible for the temperature in the furnace to be varied (curves I and III—broken lines).

The reaction parameters were as follows:
Drawing path: 60 mm;
Drawing rate: 1.7 mm/day;
Reaction period: (60:1.7=35 days);
Filling degree of ampoule: 80%;
Working pressure (argon): 46 bars.

The ampoule was ultimately allowed to cool completely and it was then crushed. 5.6 g of a compact anthracite-grey $\beta$-ZnP$_2$ substance piece was obtained which had the same geometrical configuration as the ampoule. A diamond saw was used to cut the piece to slices 2–5 mm thick and 10–12 mm wide, which were subsequently polished first with natural and electrocorundum having a given particle size and finally with a diamond paste. The existence of a monocrystal was established X-ray photographically by photographs taken around the three crystallographic axes of the elementary cell as polycrystalline regions could not be found to exist.

We claim:

1. A process for making $\beta$-zinc diphosphide monocrystals ($\beta$-ZnP$_2$) having a diameter of at least 7 mm which comprises: filling a quartz ampoule having a constriction formed in the upper end portion up to 70–90% its volume with polycrystalline $\beta$-ZnP$_2$; sealing the ampoule; subliming the polycrystalline $\beta$-ZnP$_2$ followed by condensing the $\beta$-ZnP$_2$ from the gas phase into the upper ampoule portion to form monocrystalline $\beta$-ZnP$_2$ wherein the ampoule is conveyed in upright position at a velocity of 0.5–2.5 mm/day over a period of 24 to 120 days through a kiln in which the temperature gradient from below to above is defined by a lower inlet temperature of 580°–780° C., a mean maximum temperature of 800°–950° C. and an upper outlet temperature of 350°–400° C.; maintaining the quartz ampoule under an outer inert gas pressure of 20–60 bars while being conveyed through the heated kiln; crushing the ampoule coming from the furnace and recovering the $\beta$-ZnP$_2$ monocrystal.

2. A process as claimed in claim 1, wherein the $\beta$-ZnP$_2$ monocrystal is sliced.

* * * * *